(12) United States Patent
Watase et al.

(10) Patent No.: US 7,622,792 B2
(45) Date of Patent: Nov. 24, 2009

(54) SEMICONDUCTOR DEVICE AND METHOD OF MANUFACTURING THE SAME

(75) Inventors: Kazumi Watase, Kyoto (JP); Tsuyoshi Hamatani, Shiga (JP)

(73) Assignee: Panasonic Corporation, Osaka (JP)

( * ) Notice: Subject to any disclaimer, the term of this patent is extended or adjusted under 35 U.S.C. 154(b) by 325 days.

(21) Appl. No.: 11/635,656

(22) Filed: Dec. 8, 2006

(65) Prior Publication Data
US 2007/0132096 A1    Jun. 14, 2007

(30) Foreign Application Priority Data
Dec. 8, 2005   (JP)   ............. 2005-354196
Oct. 4, 2006   (JP)   ............. 2006-272365

(51) Int. Cl.
    *H01L 23/552* (2006.01)
    *H01L 23/48* (2006.01)
(52) U.S. Cl. .............. 257/659; 257/758; 257/173; 257/355; 257/E23.116
(58) Field of Classification Search ............... 257/758, 257/173, 355, 659, E23.116
    See application file for complete search history.

(56) References Cited

U.S. PATENT DOCUMENTS

| | | | |
|---|---|---|---|
| 5,751,041 A * | 5/1998 | Suzuki et al. ............. | 257/357 |
| 6,016,000 A * | 1/2000 | Moslehi ............. | 257/522 |
| 6,064,094 A * | 5/2000 | Intrater et al. ............. | 257/355 |
| 6,580,121 B2 * | 6/2003 | Hisamoto ............. | 257/328 |
| 6,730,985 B2 * | 5/2004 | Shiina ............. | 257/546 |
| 6,762,466 B2 * | 7/2004 | Huang et al. ............. | 257/395 |
| 6,879,020 B2 * | 4/2005 | Yamaguchi ............. | 257/529 |
| 7,217,979 B2 | 5/2007 | Matsunaga et al. ............. | 257/355 |
| 2004/0217477 A1 * | 11/2004 | Tsai et al. ............. | 257/758 |

FOREIGN PATENT DOCUMENTS

| | | |
|---|---|---|
| JP | 3-104761 | 10/1991 |
| JP | 06029471 A | 2/1994 |
| JP | 10-125910 | 5/1998 |
| JP | 11-008351 | 1/1999 |
| JP | 2005-019452 | 1/2005 |

* cited by examiner

*Primary Examiner*—Nitin Parekh
(74) *Attorney, Agent, or Firm*—Steptoe & Johnson LLP

(57) ABSTRACT

A conductive region electrically connected to a buffer coat film is formed on at least one corner of a semiconductor substrate, so that electricity charged on a package seal resin or a surface of the buffer coat film is allowed to flow toward the conductive region through a conductive path. Thus, density of the electricity charged on the package seal resin or the surface of the buffer coat film is lowered, and electric discharge can be suppressed. Since the electric discharge is suppressed, no high voltage is applied to an external input/output terminal. As a result, it is possible to prevent a circuit metal wire connected to an integrated circuit from being fused and an interlayer insulating film from being damaged.

11 Claims, 5 Drawing Sheets

SEMICONDUCTOR DEVICE AND METHOD OF MANUFACTURING THE SAME

BACKGROUND OF THE INVENTION (1) Field of the Invention

The present invention relates to a semiconductor device and a method of manufacturing the same. Herein, the semiconductor device has a structure that a buffer coat film for preventing a filler attack by a seal resin is formed on a semiconductor substrate including a wiring layer insulated by an interlayer insulating film.

(2) Description of the Related Art

Recently, as a semiconductor integrated circuit is finely manufactured at high density, a wiring pitch between metal wires, such as power supply wires, formed on a semiconductor substrate becomes narrower. Therefore, a low-k film having a low dielectric constant is used for suppressing a parasitic capacitance of an interlayer insulating film. However, a low-k film is lower in withstand voltage and smaller in thickness than a conventional interlayer insulating film and, therefore, is finely formed as compared with a wiring pitch between metal wires. Hence, it is necessary and important to manage an apparatus and a method each used for preventing electrostatic discharge damage of an interlayer insulating film. Electrostatic discharge damage in a semiconductor device occurs as follows. That is, when static electricity in a human body or electricity charged by friction in a semiconductor device manufacturing step or a semiconductor device transferring step is discharged, high voltage in a range from several hundreds of volts to several thousands of volts is abruptly applied to an external input/output terminal, so that dielectric breakdown occurs at a gate oxide film, an interlayer insulating film and a metal wire. Thus, an integrated circuit suffers from operative failure. In order to prevent such electrostatic discharge damage, an external input/output terminal is provided with a protection circuit including a resistor and a diode in a CMOS device. As a result, an integrated circuit is protected from overvoltage to be applied thereto.

FIG. 7 is a circuit diagram illustrating one example of a conventional protection circuit in an external input terminal.

In the protection circuit illustrated in FIG. 7, a resistor 112 decreases applied high voltage to an applied noise level. Meanwhile, when current is supplied to a power supply (Vcc) line and a ground (GND) line through a protection diode 113 and a protection diode 114, respectively, a gate oxide film 111 is prevented from direct application of the discharged high voltage, so that a semiconductor device is protected. In such a protection circuit, however, the current flowing in the protection diode 113 and the protection diode 114 is limited in quantity; therefore, the protection diode 113 and the protection diode 114 suffer from junction damage in some cases if energy of applied noise is large. Herein, the resistor 112 typically has a resistivity in a range from 1 kΩ to 10 kΩ. Further, the resistor 112 takes a form of a diffusion layer or is made of polysilicon.

FIG. 8 is a sectional view illustrating a structure near an element electrode in a conventional semiconductor device.

As illustrated in FIG. 8, for example, the semiconductor device includes a semiconductor substrate 101, a plurality of element electrodes 104, a passivation film 105 and a buffer coat film 106. Herein, the semiconductor substrate 101 includes an interlayer insulating film 102 and a metal wire 103. Each of the plurality of element electrodes 104 is formed on the semiconductor substrate 101 to perform external signal input/output. The passivation film 105 having openings is formed on the semiconductor substrate 101. In each opening, the element electrode 104 is entirely or partially exposed. The buffer coat film 106 is formed on the passivation film 105 in order to prevent a filler attack by a seal resin. The buffer coat film 106 is typically made of an insulative organic material such as polyimide, and has a thickness of about several micrometers. Various films formed on the semiconductor substrate 101 have a thickness of several hundreds of nanometers. Therefore, it can be said that the buffer coat film 106 is very thick. Further, the buffer coat film 106 has a nature that negative electricity is readily charged on a surface thereof. Normally, the metal wire 103 is made of Al, Cu or the like.

In the conventional semiconductor device, as illustrated in FIG. 8, electricity is charged on the surface of the buffer coat film 106 on the semiconductor substrate 101 by static electricity generated in a semiconductor device manufacturing method or a semiconductor device manufacturing apparatus, so that a parasitic capacitance 107 is generated between the charged electricity and the metal wire 103. Due to the parasitic capacitance 107, the electricity is continuously charged on the surface of the buffer coat film 106. When the electricity is charged at a certain level, the parasitic capacitance 107 causes electric discharge at a position between the parasitic capacitance 107 and a nearest element electrode 104 adjoining thereto. Herein, a potential difference occurs at the relevant element electrode 104 by the parasitic capacitance 107. Due to the electric discharge, high voltage is applied to an internal circuit, and the resistor 112 and the protection diodes 113 and 114 in the conventional protection circuit illustrated in FIG. 7 cannot follow applied noise by the high voltage. Consequently, it is difficult to protect the gate oxide film 111. Further, if the applied voltage exceeds withstand voltage of the interlayer insulating film 102, the interlayer insulating film 102 is damaged and the metal wire 103 is fused, so that open/shortcircuit failure occurs between interlayer insulating films 102 or metal wires 103 in some cases. In a semiconductor device assembling step, most operations are performed in the air, and a semiconductor wafer is diced into semiconductor devices; therefore, each semiconductor device frequently suffers from an external electrical influence such as static electricity. In particular, electricity in a range from several hundreds of volts to several thousands of volts is charged on the surface of the buffer coat film 106 upon performance of back grinding or dicing. Therefore, static elimination by an ionizer is indispensable.

However, a diffusion process is subdivided in recent years. The low-k film serving as the interlayer insulating film 102 has a withstand voltage (not more than $10^6$ V/cm) lower than that ($10^7$ V/cm) of a normal interlayer insulating film. In other words, the low-k film has lowered antistatic performance. Consequently, there arises a problem that a semiconductor device is damaged due to static electricity.

SUMMARY OF THE INVENTION

The present invention is made to solve the aforementioned conventional problems. It is therefore an object of the present invention to provide a semiconductor device capable of improving antistatic performance, thereby to prevent electrostatic discharge damage of a metal wire or an interlayer insulating film, and a method of manufacturing the same.

In order to accomplish this object, the present invention provides a semiconductor device comprising: a semiconductor substrate having a semiconductor integrated circuit formed therein and element electrodes formed thereon; a protection insulating film formed on the semiconductor substrate; a buffer coat film formed on the protection insulating film on a semiconductor integrated circuit formation region; and a conductive region electrically connected to the buffer coat film.

In the semiconductor device according to the present invention, the conductive region is formed on at least one corner of the semiconductor substrate.

In the semiconductor device according to the present invention, the conductive region is formed into a ring shape at a periphery of the semiconductor substrate.

In the semiconductor device according to the present invention, the conductive region formed on the semiconductor substrate is one of a seal ring and a corner peeling suppression pattern.

In the semiconductor device according to the present invention, the buffer coat film is extended to a conductive region formation region and is connected to the conductive region.

In the semiconductor device according to the present invention, the conductive region is formed over a plurality of wiring layer regions.

In the semiconductor device according to the present invention, the conductive region is spirally formed over a plurality of wiring layer regions.

In the semiconductor device according to the present invention, the conductive region is formed over a semiconductor silicon substrate.

The present invention also provides a semiconductor device comprising: a semiconductor substrate having a semiconductor integrated circuit formed therein and element electrodes formed thereon; a protection insulating film formed on the semiconductor substrate; and a buffer coat film formed on the protection insulating film on a semiconductor integrated circuit formation region, and connected to at least one ground electrode of the element electrodes.

In the semiconductor device according to the present invention, the buffer coat film is extended toward and connected to the ground electrode.

The present invention also provides a semiconductor device manufacturing method for forming a conductive region for improving antistatic performance of a semiconductor device, the method comprising: a first step of forming the conductive region on a semiconductor substrate having a semiconductor integrated circuit formed therein and element electrodes formed thereon; a second step of forming a protection insulating film having openings on the semiconductor substrate such that the conductive region and the element electrodes are exposed in the openings; and a third step of forming, on the protection insulating film, a buffer coat film connected to the conductive region exposed in the opening.

In the semiconductor device manufacturing method according to the present invention, in the first step, the conductive region is formed together with a circuit metal wire from a lower layer.

In the semiconductor device manufacturing method according to the present invention, in the first step, the conductive region is formed over a region having a high P-type impurity concentration of a P-type region in a silicon section of the semiconductor substrate.

The present invention also provides a semiconductor device manufacturing method for forming a conductive region for improving antistatic performance of a semiconductor device, comprising: a first step of forming a protection insulating film having openings on a semiconductor substrate having a semiconductor integrated circuit formed therein and element electrodes formed thereon such that the element electrodes are exposed in the openings; and a second step of forming, on the protection insulating film, a buffer coat film connected to at least one ground electrode of the element electrodes exposed in the openings.

DESCRIPTION OF THE PREFERRED EMBODIMENTS

Hereinafter, description will be given of preferred embodiments of the present invention with reference to the drawings.

Figure 1A:
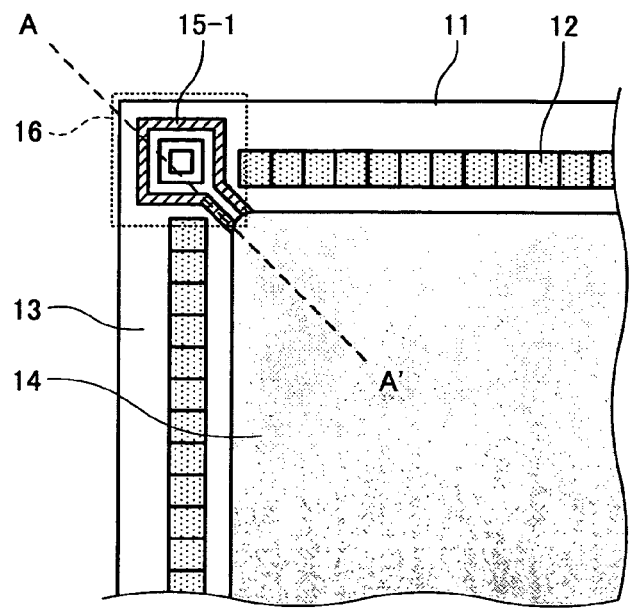
FIG. 1A is a plan view illustrating main components of a semiconductor device according to a first embodiment of the present invention.
Figure 1B:
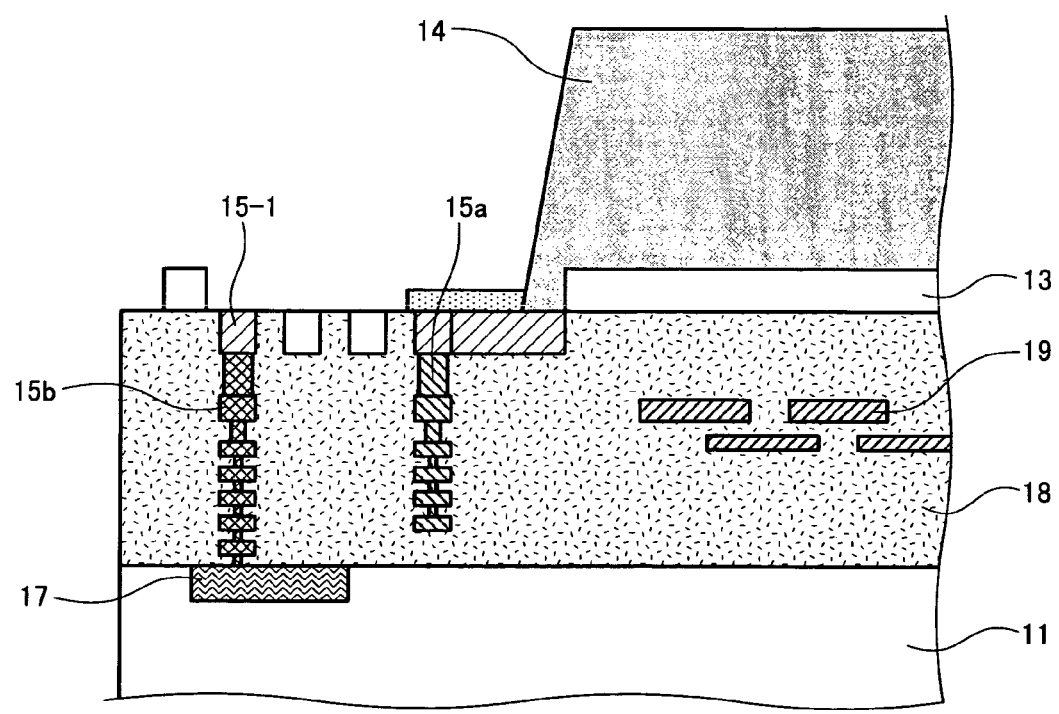
FIG. 1B is a sectional view illustrating main components of the semiconductor device according to the first embodiment of the present invention.

FIG. 1A is a plan view illustrating main components of a semiconductor device according to a first embodiment of the present invention. FIG. 1B is a sectional view taken along a line A-A' in FIG. 1A, and illustrates main components of the semiconductor device according to the first embodiment of the present invention.

Figure 2:
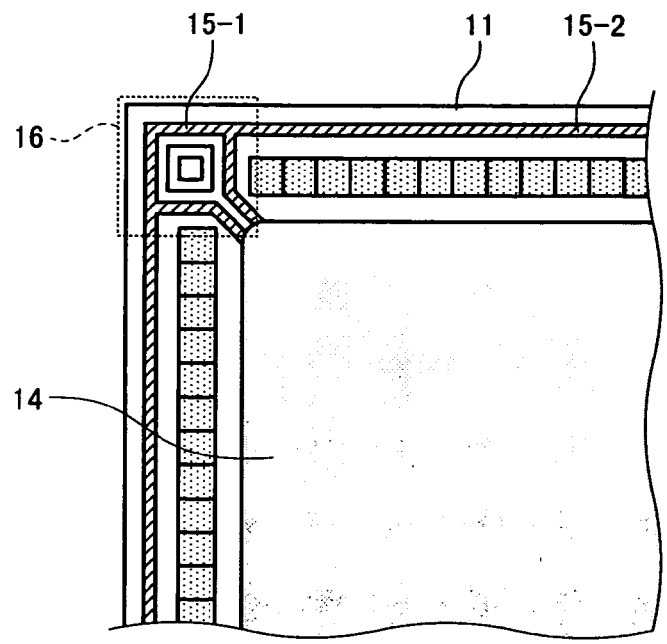
FIG. 2 is a plan view illustrating main components of a semiconductor device according to a second embodiment of the present invention.
Figure 3:
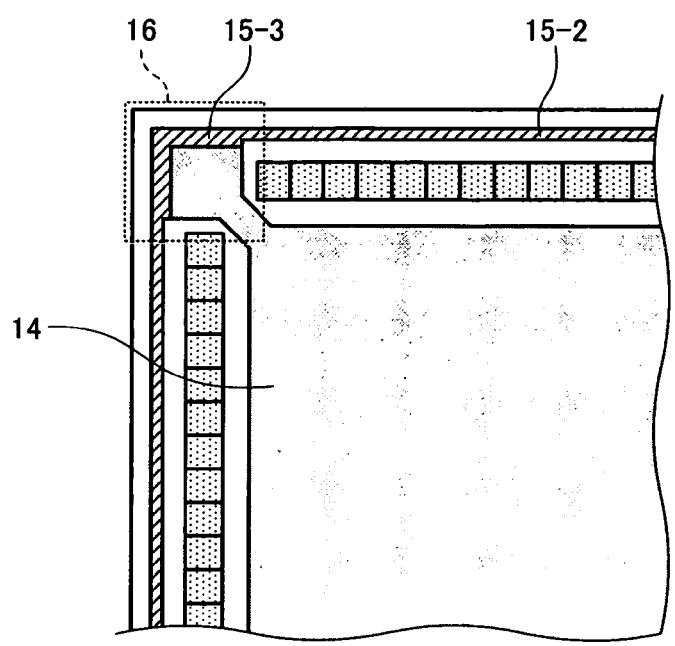
FIG. 3 is a plan view illustrating main components of a semiconductor device according to a third embodiment of the present invention.

FIG. 2 is a plan view illustrating main components of a semiconductor device according to a second embodiment of the present invention. FIG. 3 is a plan view illustrating main components of a semiconductor device according to a third embodiment of the present invention.

Figure 4:
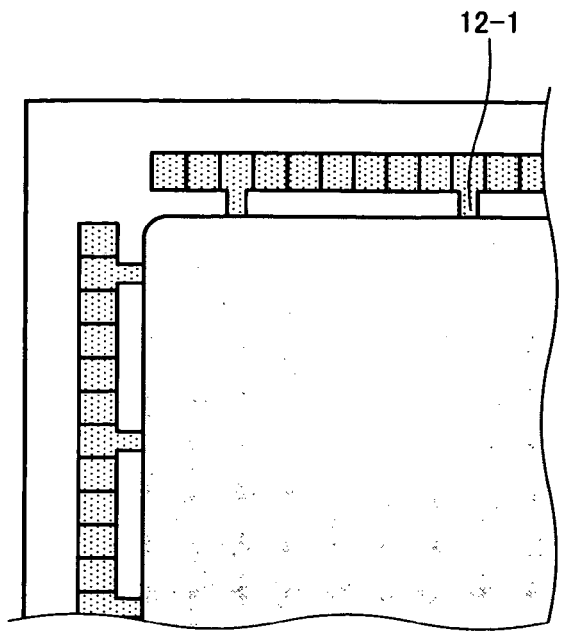
FIG. 4 is a plan view illustrating main components of a semiconductor device according to a fourth embodiment of the present invention.
Figure 5:
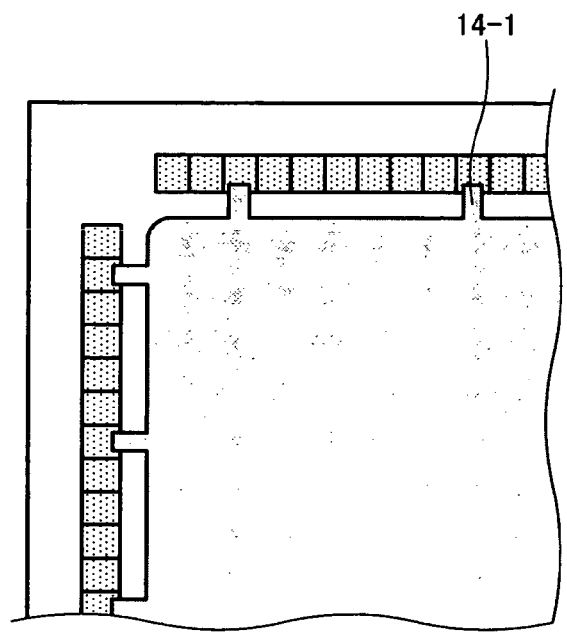
FIG. 5 is a plan view illustrating main components of a semiconductor device according to a fifth embodiment of the present invention.

FIG. 4 is a plan view illustrating main components of a semiconductor device according to a fourth embodiment of the present invention. FIG. 5 is a plan view illustrating main components of a semiconductor device according to a fifth embodiment of the present invention.

Figure 6A:
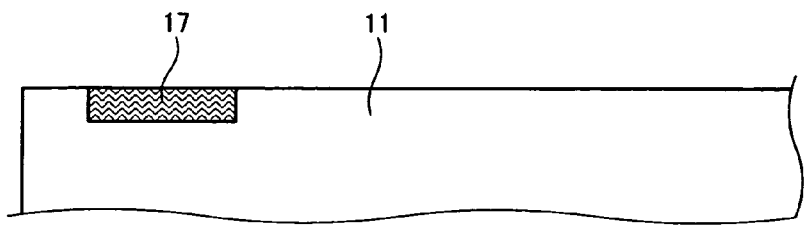
FIG. 6A is a sectional view illustrating a PD layer formation step in a semiconductor device according to the present invention.
Figure 6B:
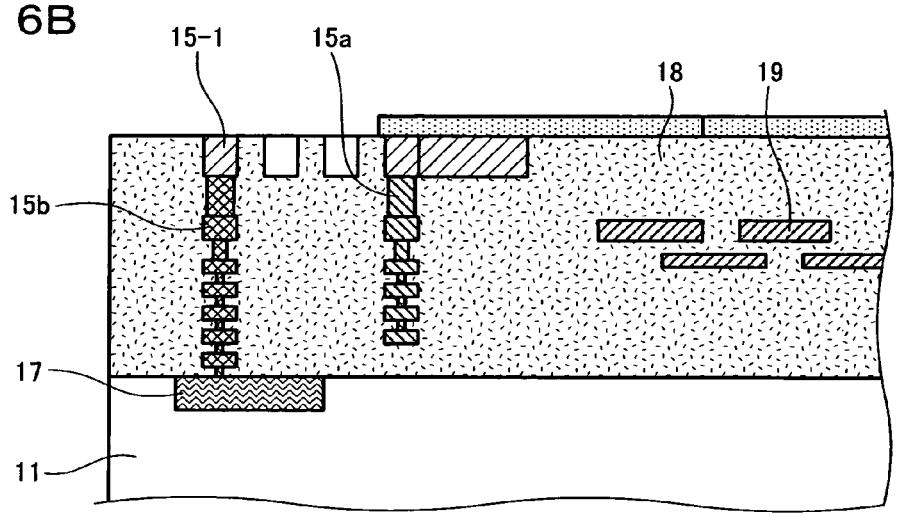
FIG. 6B is a sectional view illustrating a wiring layer formation step in the semiconductor device according to the present invention.
Figure 6C:
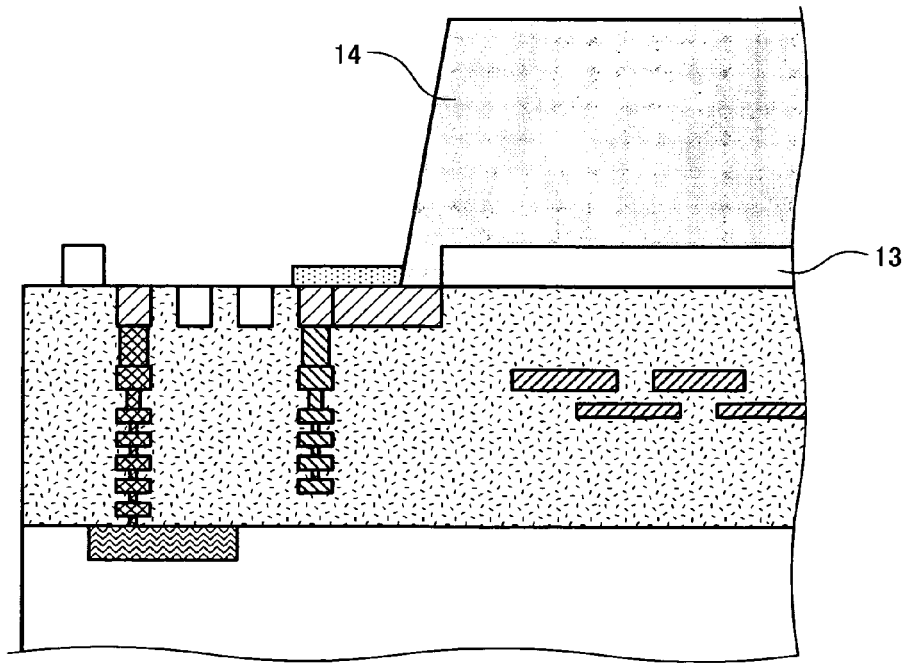
FIG. 6C is a sectional view illustrating a buffer coat film formation step in the semiconductor device according to the present invention.
Figure 7:
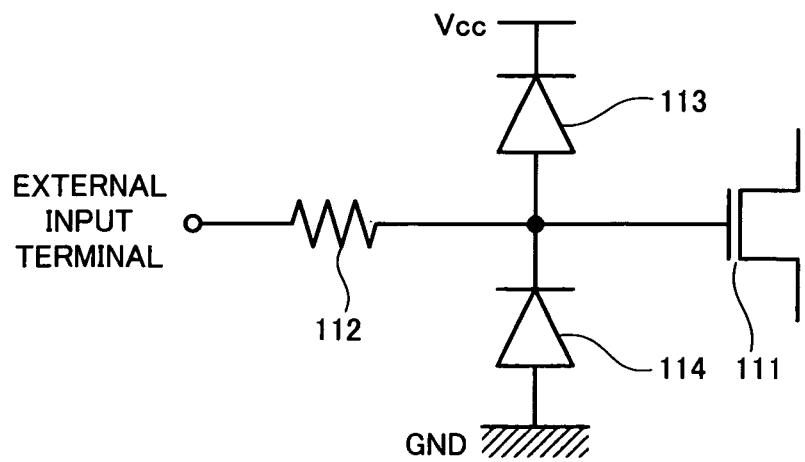
FIG. 7 is a circuit diagram illustrating one example of a conventional protection circuit in an external input terminal.
Figure 8:
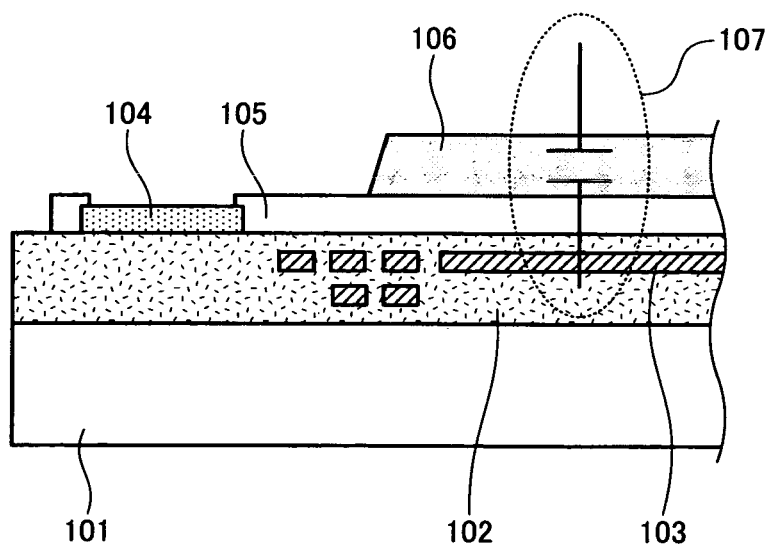
FIG. 8 is a sectional view illustrating a structure near an element electrode in a conventional semiconductor device.

FIG. 6A is a sectional view illustrating a PD layer formation step in a semiconductor device according to the present invention. FIG. 6B is a sectional view illustrating a wiring layer formation step in the semiconductor device according to the present invention. FIG. 6C is a sectional view illustrating a buffer coat film formation step in the semiconductor device according to the present invention.

First Embodiment

As illustrated in FIGS. 1A and 1B, a semiconductor integrated circuit including semiconductor elements such as a transistor is formed in a semiconductor substrate 11. A plurality of element electrodes 12 are formed on the semiconductor substrate 11 to perform external signal input/output. A passivation film 13 serving as a protection insulating film has openings and is formed entirely on the semiconductor substrate 11. In the openings, the plurality of element electrodes 12 are at least partially exposed, respectively. A buffer coat film 14 having an insulating property is formed on the passivation film 13 on a semiconductor integrated circuit formation region. Typically, the buffer coat film 14 is made of a photosensitive organic material such as polyimide. The buffer coat film 14 is subjected to patterning with good accuracy by photolithography and has a thickness of about several micrometers. A conductive region 15-1 is formed on a corner 16 of the semiconductor substrate 11. Similarly to the plurality of element electrodes 12, the conductive region 15-1 is at least partially exposed in one of the openings of the passivation film 13. The exposed conductive region 15-1 has a wire coming into contact with an end of a surface of the buffer coat film 14. Thus, a conductive path is formed, and electricity charged on the surface of the buffer coat film 14 flows toward the conductive region 15-1 through the conductive path. In particular, the electricity is charged on an outer periphery of the surface of the buffer coat film 14 at high density; therefore, electric discharge readily occurs at the outer periphery. In order to avoid the electric discharge, the conductive path is formed at the corner 16 of the semiconductor substrate 11. Through this conductive path, the electricity readily flows from the element electrode 12 having a metal portion exposed therein toward the conductive region 15-1. A shape of the conductive region 15-1 formed on the corner 16 is not particularly limited as long as it is a formable pattern. In FIG. 1A, as an example, the conductive region 15-1 formed into an annular shape is formed outside an annular alignment mark for photolithography. Alternatively, the alignment mark for photolithography is formed by a conductive material, like a wiring layer, in order to form a conductive path to the conductive region 15-1; thus, a conductive region having a double annular structure may be formed. Still alternatively, the alignment mark for photolithography may be used as the conductive region 15-1. Further, in order to secure a formation area of the conductive region 15-1 as large as possible, the conductive region 15-1 may be formed outside the corner 16. Thus, it is possible to increase an amount of electricity stored in the conductive region 15-1 and to improve antistatic performance of the semiconductor device.

When the electricity charged on the surface of the buffer coat film 14 flows toward the conductive region 15-1, an interlayer insulating film 18 is prevented from dielectric breakdown, and an integrated circuit is prevented from damage due to fusion of a circuit metal wire 19. Upon occurrence of electric discharge, high voltage is applied to the conductive region 15-1, leading to dielectric breakdown in the conductive region 15-1. However, the conductive region 15-1 is separated from an element circuit such as the corner 16 of the semiconductor substrate 11 and, therefore, exerts no adverse influence on quality such as circuit characteristics. Further, the conductive region 15-1 is formed on each of a plurality of corners of the semiconductor substrate 11, and the electricity charged on the surface of the buffer coat film 14 flows toward the plurality of conductive regions 15-1 through a plurality of conductive paths. Thus, it is possible to decrease the density of the electricity charged on the surface of the buffer coat film 14, and to suppress the occurrence of the electric discharge. On the corner 16 of the semiconductor substrate 11, a compressive stress of a seal resin for a package is concentrated, so that peeling of the interlayer insulating film 18 occurs frequently. In order to avoid the peeling, a peeling suppression pattern is provided on the corner 16 of the semiconductor substrate 11 in some cases. This peeling suppression pattern may be used as the conductive region 15-1 without exerting an adverse influence on quality of a circuit. The conductive region 15-1 may be made of a material identical to that of a circuit metal wire 19 for the integrated circuit. Specific examples of the material include metal materials such as Al and Cu.

As described above, when a conductive region electrically connected to a buffer coat film is formed on at least one corner of a semiconductor substrate, electricity charged on the buffer coat film flows toward the conductive region. Therefore, it is possible to suppress application of high voltage to a circuit region due to electric discharge to an element electrode. Thus, it is possible to prevent electrostatic discharge damage of a metal wire or an interlayer insulating film, and to improve antistatic performance of a semiconductor device.

As illustrated in FIG. 1B, a metal wire 15a, obtained by electrically connecting wires formed in at least one wiring layer to each other, is electrically connected to the conductive region 15-1. The electricity charged on the surface of the buffer coat film 14 flows into the metal wire 15a, so that the density of the electricity charged on the surface of the buffer coat film 14 is decreased. In order to decrease such density, further, the metal wire 15a is connected to the semiconductor substrate 11, so that the electricity charged on the surface of the buffer coat film 14 flows into the semiconductor substrate 11. Moreover, a PD layer 17 serving as a P-type diffusion region having a high P-type impurity concentration is formed on a P-type substrate on the semiconductor substrate 11. In addition, a metal wire 15b having a configuration similar to that of the metal wire 15a is formed to electrically connect between the PD layer 17 and the conductive region 15-1. As a result, the electricity charged on the surface of the buffer coat film 14 flows into the metal wire 15b and is stored in the PD layer 17, so that the density of the electricity charged on the surface of the buffer coat film 14 can be further decreased. Thus, it is possible to suppress electric discharge and to improve antistatic performance against external static electricity exerting an adverse influence on the semiconductor device. As for the metal wire 15a or 15b, further, when each layer is formed spirally, a wiring length can be extended. As a result, it is possible to increase an amount of electricity flowing in the metal wire 15a or 15b, and to improve antistatic performance. Each of the metal wires 15a and 15b has a wiring dimension identical to that of a circuit wire. There arise no problems in regard to a process rule. Further, each of the metal wires 15a and 15b is made of a material identical that of the circuit metal wire 19 of the integrated circuit. Specific examples of the material include metal materials such as Al and Cu.

Second Embodiment

As illustrated in FIG. 2, a ring-shaped conductive region 15-2 electrically connected to a conductive region 15-1 is formed along an outer periphery of a semiconductor substrate 11. Herein, no element circuit is formed on the outer periphery of the semiconductor substrate 11. The ring-shaped conductive region 15-2 makes it possible to secure a conductive path having a larger area and a larger capacity. When electricity charged on a surface of a buffer coat film 14 flows into the conductive region 15-2, density of the electricity charged on the surface of the buffer coat film 14 is decreased. As a result, it is possible to suppress electric discharge and to improve antistatic performance against external static electricity exerting an adverse influence on a semiconductor device. Typically, a seal ring is provided along the outer periphery of the semiconductor substrate 11 in order to suppress peeling of an interlayer insulating film by dicing and to prevent intrusion of external water into the semiconductor substrate 11. Therefore, the seal ring can be used as the conductive region 15-2 without exerting an adverse influence on quality of a circuit. The conductive region 15-2 may be made of a material identical to that of a circuit metal wire 19 of the integrated circuit. Specific examples of the material include metal materials such as Al and Cu.

Similarly to the first embodiment, when a metal wire 15a, a metal wire 15b connected to a PD layer 17, and the like are additionally provided in combination with the conductive region 15-2, antistatic performance can be further improved.

Third Embodiment

In the semiconductor device according to the first or second embodiment, as illustrated in FIG. 3, the buffer coat film 14 is extended to an exposed conductive region 15-3 on the corner 16 of the semiconductor substrate 11. As a result, the end of the surface of the buffer coat film 14 comes into contact with the exposed conducive region 15-3; thus, a conductive path can be formed. When the buffer coat film 14 is formed so as to reach the corner 16 of the semiconductor substrate 11 and the conductive region 15-3 is reduced in area, the corner 16 of the semiconductor substrate 11 can secure an area, on which circuit metal wires are arranged, as large as possible. As a result, it is possible to prevent electrostatic discharge damage of a metal wire or an interlayer insulating film, to improve antistatic performance of the semiconductor device, and to suppress an increase in chip area. Typically, the buffer coat film 14 is made of a photosensitive organic material such as polyimide. The buffer coat film 14 has a large degree of freedom in patterning and, therefore, can be subjected to patterning with good dimensional accuracy by photolithography. The conductive region 15-3 may be made of a material identical to that of the circuit metal wire 19 of the integrated circuit. Specific examples of the material include metal materials such as Al and Cu.

Similarly to the first embodiment, when the metal wire 15a, the metal wire 15b connected to the PD layer 17, and the like are additionally provided in combination with the conductive region 15-3, the antistatic performance can be further improved.

Fourth Embodiment

As illustrated in FIG. 4, a semiconductor integrated circuit including semiconductor elements such as a transistor is formed in a semiconductor substrate 11. A plurality of element electrodes 12 and element wires 12-1 are formed on the semiconductor substrate 11 to perform external signal input/output. A passivation film 13 serving as a protection insulating film has openings and is formed entirely on the semiconductor substrate 11. In the openings, the plurality of element electrodes 12 are at least partially exposed, respectively. A buffer coat film 14 having an insulating property is formed on the passivation film 13 on a semiconductor integrated circuit formation region. Typically, the buffer coat film 14 is made of a photosensitive organic material such as polyimide. The buffer coat film 14 is subjected to patterning with good accuracy by photolithography and has a thickness of about several micrometers. Similarly to the plurality of element electrodes 12, each of the element wires 12-1 is exposed in one of the openings of the passivation film 13, and comes into contact with an end of a surface of the buffer coat film 14. Thus, a conductive path is formed, and electricity charged on the surface of the buffer coat film 14 flows into the element wire 12-1 through the conductive path. In particular, the electricity is charged on an outer periphery of the surface of the buffer coat film 14 at high density; therefore, electric discharge readily occurs at the outer periphery. In order to avoid the electric discharge, the conductive path is formed at the element wire 12-1. Through this conductive path, the electricity readily flows. Herein, the element electrode 12 connected to the buffer coat film 14 through the element wire 12-1 is used as a ground (GND) electrode. This ground electrode is grounded to a PD layer of the semiconductor substrate 11. Therefore, the electricity flows from the buffer coat film 14 into the PD layer through the element wire 12-1 and the element electrode 12 used as the ground electrode without exerting an adverse influence on an internal circuit.

When the plurality of element wires 12-1 on the semiconductor substrate 11 are connected to the buffer coat film 14, the density of the electricity charged on the surface of the buffer coat film 14 can be decreased and occurrence of electric discharge can be suppressed.

As described above, when at least one element electrode 12 serving as the ground electrode on the semiconductor substrate 11 is electrically connected to the buffer coat film 14, the electricity charged on the surface of the buffer coat film 14 flows into the semiconductor substrate 11 through the element wire 12-1. Therefore, it is possible to suppress application of high voltage to a circuit region due to electric discharge. Thus, it is possible to prevent electrostatic discharge damage of a metal wire or an interlayer insulating film, and to improve antistatic performance of a semiconductor device.

Fifth Embodiment

In the semiconductor device according to the fourth embodiment, as illustrated in FIG. 5, a buffer coat film 14-1 is additionally provided such that the buffer coat film 14 comes into contact with the element electrode 12 serving as the ground electrode. Thus, the end of the surface of the buffer coat film 14-1 comes into contact with the element electrode 12 partially exposed in the opening of the passivation film 13, so that a conductive path can be formed. Further, the buffer coat film 14 can be formed so as to reach the element electrode 12 without exerting an adverse influence on wiring design of the internal circuit. As a result, it is possible to improve the antistatic performance of the semiconductor device, and to suppress an increase in chip area. Typically, the buffer coat film 14 is made of a photosensitive organic material such as polyimide. The buffer coat film 14 has a large degree of freedom in patterning and, therefore, can be subjected to patterning with good dimensional accuracy by photolithography.

Sixth Embodiment

Hereinafter, description will be given of a method of manufacturing the semiconductor device according to the present invention with reference to FIGS. 6A to 6C.

First, as illustrated in FIG. 6A, a PD layer 17 is formed on a P-type substrate of a semiconductor substrate 11 including a semiconductor integrated circuit.

Next, as illustrated in FIG. 6B, a metal wire 15a and a metal wire 15b are formed by a circuit wire formation technique (sputtering, etching), similarly to a circuit metal wire 19. Then, an interlayer insulating film 18 is formed by an interlayer insulating film formation technique (plasma CVD).

Finally, as illustrated in FIG. 6C, a passivation film 13 having openings is formed. Herein, a conductive region 15-1 is exposed in one of the openings. Then, a buffer coat film 14 is formed on the passivation film 13 such that an end of a surface thereof is connected to the conductive region 15-1 exposed in the opening of the passivation film 13.

As described above, the passivation film 13 and the end of the surface of the buffer coat film 14 are connected to the conductive region 15-1 including the metal wire 15a and the metal wire 15b; thus, a conductive path is formed. The aforementioned components can be formed by an interlayer insulating film formation technique (plasma CVD) and a circuit wire formation technique (sputtering, etching) each used when a product circuit is formed. Therefore, it is unnecessary to increase manufacturing steps and to prolong a time for a manufacturing process. Even when the metal wire 15a extends from the opening in the passivation film 13 to a lower layer, a method thereof is identical to the process for forming the product circuit; therefore, there arise no problems. In order to further decrease the density of the electricity charged on the surface of the buffer coat film 14, the PD layer 17 is formed on the P-type substrate on the semiconductor substrate 11 in advance, and is connected to the metal wire 15b. Thus, the electricity charged on the surface of the buffer coat film 14 can flow into the PD layer 17 through the metal wire 15b as large as possible. As for the PD layer 17 formed on the P-type substrate, a concentration is varied by control of an ion implantation amount, so that an amount of electricity to be stored can be adjusted. Moreover, when the peeling suppression pattern formed on the corner 16 of the semiconductor substrate 11 or the seal ring formed along the outer periphery of the semiconductor substrate 11 is used as the conductive region 15-1, no adverse influence is exerted on the manufacturing process and design of an element circuit of a semiconductor device.

What is claimed is:

1. A semiconductor device comprising:
a semiconductor substrate having a semiconductor integrated circuit formed therein and element electrodes formed thereon;
a protection insulating film formed on the semiconductor substrate having openings to expose a conductive region and the element electrodes;.
a buffer coat film formed on the protection insulating film on a semiconductor integrated circuit formation region; the
conductive region electrically connected to the buffer coat film and wherein the conductive region is in a ring shape at a periphery of the semiconductor substrate.

2. The semiconductor device according to claim 1, wherein the conductive region is formed on at least one corner of the semiconductor substrate.

3. The semiconductor device according to claim 2, wherein the buffer coat film is extended to a conductive region formation region and is connected to the conductive region.

4. The semiconductor device according to claim 2, wherein the conductive region is formed over a plurality of wiring layer regions.

5. The semiconductor device according to claim 4, wherein the conductive region is formed over a semiconductor silicon substrate.

6. The semiconductor device according to claim 1, wherein the conductive region formed on the semiconductor substrate is one of a seal ring and a corner peeling suppression pattern.

7. The semiconductor device according to claim 1, wherein the conductive region is formed over a plurality of wiring layer regions.

8. The semiconductor device according to claim 7, wherein the conductive region is formed over a semiconductor silicon substrate.

9. The semiconductor device according to claim 2, wherein the conductive region is spirally formed over a plurality of wiring layer regions.

10. A semiconductor device comprising:
a semiconductor substrate having a semiconductor integrated circuit formed therein and element electrodes formed thereon;
a protection insulating film formed on the semiconductor substrate having openings to expose a conductive region and the element electrodes.
a buffer coat film formed on the protection insulating film on a semiconductor integrated circuit formation region, and connected to at least one ground electrode of the element electrodes and wherein the conductive region is in a ring shape at a periphery of the semiconductor substrate.

11. The semiconductor device according to claim 10, wherein the buffer coat film is extended toward and connected to the ground electrode.

* * * * *